US006838151B2

(12) United States Patent
Kato

(10) Patent No.: US 6,838,151 B2
(45) Date of Patent: Jan. 4, 2005

(54) CUTTING TOOL AND TOOL WITH HOLDER

(75) Inventor: Hideki Kato, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/153,726

(22) Filed: May 24, 2002

(65) Prior Publication Data

US 2002/0176753 A1 Nov. 28, 2002

(30) Foreign Application Priority Data

May 25, 2001  (JP) ........................................ 2001-157481

(51) Int. Cl.$^7$ ............................................. B32B 27/14
(52) U.S. Cl. ...................... 428/143; 428/141; 428/332; 204/192.38; 407/119
(58) Field of Search ...................... 204/192.16, 192.38; 428/141, 143, 332, 142, 336, 469, 472, 698, 699; 407/119

(56) References Cited

U.S. PATENT DOCUMENTS

| | | | | |
|---|---|---|---|---|
| 5,376,444 A | * | 12/1994 | Grotepass et al. | .......... 428/336 |
| 5,709,907 A | * | 1/1998 | Battaglia et al. | .......... 427/126.1 |
| 5,879,823 A | * | 3/1999 | Prizzi et al. | ................ 428/698 |
| 6,033,734 A | * | 3/2000 | Muenz et al. | ................ 427/309 |

FOREIGN PATENT DOCUMENTS

| | | |
|---|---|---|
| JP | 2901043 B2 | 3/1999 |
| WO | WO 94/08745 A1 | 4/1994 |

OTHER PUBLICATIONS

Konyashin, et al., "Nanograined Titanium Nitride Thin Films," Advanced Materials, 10, No. 12, 1998, pp. 952–955.
Musil, et al., "Superhard Nanocomposite $Ti_{1-x}Al_xN$ Films Prepared by Magnetron Sputtering," Thin Solid Films, 365, 2000, pp. 104–109.

* cited by examiner

Primary Examiner—Harold Pyon
Assistant Examiner—Alicia Chevalier
(74) Attorney, Agent, or Firm—Sughrue Mion, PLLC

(57) ABSTRACT

A cutting tool 1 includes a hard coating formed on the surface of a substrate formed of, for example, a hard material of cemented carbide (WC-Co-type cemented carbide) equivalent to JIS K10 and polished into the shape of ISO SPGN120312. The cutting tool 1 has a plate-shape with a rake face (the main surface side) that is wider than the opposite face. The hard coating has a thickness in the range of from 1 μm to 5 μm, is formed of a TiAlN material, and has a Ti/Al ratio of 1. Coarse grains present in the hard coating and having a size not less than coating thickness occupy an area percentage not greater than 5% by area. The hard coating has a surface roughness Ra of not greater than 0.1 μm and a surface roughness Rz of not greater than 1 μm.

9 Claims, 4 Drawing Sheets

CUTTING TOOL
OF THE INVENTION

CUTTING TOOL OF THE INVENTION

CONVENTIONAL CUTTING TOOL

FIG. 5
Table

| Sample No. | PVD Condition | Coating thickness [μm] | Area percentage of coarse grains [%] | Surface smoothness | | Chipping resistance (dry type) [number of times] | Thermal shock resistance (wet type) [number of times] | Remarks |
|---|---|---|---|---|---|---|---|---|
| | | | | Ra [μm] | Rz [μm] | | | |
| 1 | 1 | 0.5 | 2 | 0.05 | 0.45 | 15000 | 3500 | Comparative Example |
| 2 | 1 | 1 | 3 | 0.06 | 0.56 | 23000 | 7500 | Example |
| 3 | 1 | 3 | 3 | 0.07 | 0.58 | 28000 | 10000 | Example |
| 4 | 1 | 5 | 5 | 0.09 | 0.90 | 25000 | 8000 | Example |
| 5 | 1 | 7 | 5 | 0.08 | 0.97 | 12000 | 2500 | Comparative Example |
| 6 | 3 | 3 | 7 | 0.35 | 2.07 | 15000 | 4000 | Comparative Example |
| 7 | 2 | 3 | 4 | 0.17 | 1.2 | 19000 | 6000 | Example |

CUTTING TOOL AND TOOL WITH HOLDER

BACKGROUND OF THE INVENTION

1. Field of the Invention

The present invention relates to a cutting tool coated with a hard coating exhibiting excellent adhesion resistance and excellent wear resistance and to a tool with a holder incorporating the same.

2. Description of the Related Art

Conventionally, an arc-ion-type PVD process has been frequently employed for PVD coating with a TiAlN material (coating through physical vapor deposition), since high energy is required for ionization of a TiAl metal and since the process has the advantage, among others, that a coating layer of excellent adhesion is readily obtained.

However, in some cases, this process permits the generation of coarse TiAl grains which is caused by a local concentration of arc derived from the non-uniform surface condition of a TiAl target or a non-uniform generation of arc. As a result, the deposition of coarse TiAlN grains occurs.

Some coarse grains have a size of several micrometers to several tens of micrometers. When such coarse grains are present on the surface of a coating that is provided on a cutting tool, the following problem is encountered: contact of the surface with chips from a work material, mechanical vibration, or the like may cause the coarse grains to drop off of the tool. Exposure of a substrate that results from the coarse grains dropping off from the tool has sometimes caused unstable cutting performance (e.g., adhesion resistance and wear resistance), and in the worst case impairs the cutting performance.

To cope with the above problem, PVD apparatus manufacturers and cutting tool manufacturers have investigated coating conditions and coating processes that can eliminate coarse grains. At present, to reduce the generation of coarse grains, a load current to a target is decreased, a trap for eliminating the coarse grains is provided between a target and a substrate to be coated, or a similar method is employed.

However, the above-mentioned methods impair productivity and increase costs since the coating deposition rate drops.

Some coatings provide improved surfaces in which the generation of coarse grains is prevented through employment of a multilayer structure consisting of TiN, AlN, etc. However, these multilayer structures fail to sufficiently exhibit inherent properties of the TiAlN film in relation to heat resistance, wear resistance, etc., and thus the performance thereof is not satisfactory.

As described in Japanese Patent No. 2901043, an improvement in performance is attempted by eliminating coarse grains after coating to thereby establish a surface having craters formed thereon. However, this technique involves the following practical problem. In some cases, the substrate may be exposed at a crater portion of the coating. When a work material adheres to the crater portion through fusion, and the crater portion is exfoliated, a surrounding portion of the hard coating or the substrate is chipped off together with the adhered work material. As a result, unusual wear is initiated from the chipped portion, and thus satisfactory performance is not necessarily exhibited. Further, since a process for eliminating coarse grains must be carried out after coating, productivity is impaired and an increase in cost results.

SUMMARY OF THE INVENTION

The present invention has been accomplished in view of the foregoing, and an object of the invention is to provide a cutting tool coated with a hard coating capable of reliably and favorably exhibiting cutting performance, such as adhesion resistance and wear resistance, as well as a tool with a holder incorporating the same.

To achieve the above object, the present inventors have studied conditions for allowing a TiAlN-type PVD film to reliably and favorably maintain cutting performance and have found that through control of the size and amount of coarse grains within certain respective ranges and through determination of surface smoothness by use of surface roughness, wear resistance can be stabilized, thus leading to achievement of the present invention.

(1) According to the invention, a cutting tool comprises a substrate and a TiAlN-type hard coating formed on the substrate. The hard coating has a thickness of 1 to 5 $\mu$m, and coarse grains present in the hard coating and having a size not less than the thickness of the hard coating occupy an area percentage not greater than 5% by area.

The thickness of the hard coating is specified as 1 $\mu$m to 5 $\mu$m for the following reason. When the thickness is less than 1 $\mu$m, desired cutting performance (i.e., high resistance to joining through fusion and wear resistance) is not exhibited. When the thickness exceeds 5 $\mu$m, residual stress of the coating increases, and thus the coating fractures with a resultant impairment in cutting performance.

The size of the coarse grains (whose amount is specified in terms of % by area) is specified as being not less than the thickness of the hard coating on the substrate surface for the following reason. When a grain having a size not less than the coating thickness drops off during cutting, exposure of the substrate becomes highly likely. When the substrate is exposed, joining through fusion and exfoliation arise, resulting in the occurrence of unusual wear. In other words, when coarse grains have a size less than the thickness of the hard coating, dropping-off of a coarse grain does not lead to exposure of the substrate, whereby an impairment in cutting performance can be restrained. Therefore, the size of the coarse grains to be limited in amount is specified as being not less than the thickness of the hard coating.

Further, the area percentage of the coarse grains present in the hard coating and having a size not less than the thickness of the hard coating is specified as being not greater than 5% by area for the following reason. When the area percentage is in excess of 5%, the possibility that cutting performance is impaired by the dropping-off of a grain increases. The area percentage is more preferably not greater than 3%. Even in the case of grains having a size less than the coating thickness, smaller amounts are preferred.

Since the invention is constructed as described above, an impairment in cutting performance, which would otherwise arise from the dropping-off of a coarse grain, does not arise, whereby excellent cutting performance can be reliably maintained over a long period of time.

(2) According to a second preferred aspect of the invention, in the cutting tool as described above, the hard coating satisfies at least either a requirement for a surface roughness Ra of not greater than 0.1 $\mu$m or a requirement for a surface roughness Rz of not greater than 1 $\mu$m.

In the invention of this aspect, the surface smoothness of the hard coating satisfies at least either a requirement for Ra not greater than 0.1 $\mu$m or a requirement for Rz not greater than 1 $\mu$m.

When the above-mentioned requirements for surface roughness are not satisfied, in the course of a work material rubbing against coating surface, dropping-off of a grain becomes highly likely, and frictional resistance increases. As a result, joining of a work material through fusion (and subsequent exfoliation) becomes likely to occur, possibly resulting in an impairment in cutting performance.

Notably, Ra refers to the known average roughness along a centerline Ra, and Rz refers to the known 10-point average roughness Rz.

(3) According to a third preferred aspect of the invention, in the cutting tool as described above, the substrate is formed of a hard material, such as cemented carbide, cermet, ceramic, or high-speed steel.

The invention of this aspect is drawn to an embodiment of a material used to form the substrate of the cutting tool. Use of such a material enables high cutting performance.

(4) According to a fourth preferred aspect of the invention, in the cutting tool as described above, the hard coating is a vapor deposition film formed through arc-ion-type physical vapor deposition.

The invention of this aspect is drawn to an embodiment of a hard coating. A vapor deposition film formed through arc-ion-type physical vapor deposition can favorably form a dense hard coating on the surface of the substrate.

(5) According to a fifth preferred aspect of the invention, a tool with a holder is provided, and a cutting tool according to the invention as described above is mounted on the holder.

The invention of this aspect contemplates a tool with a holder, configured such that a cutting tool (e.g., a tip) is mounted on a holder.

(6) According to a sixth preferred aspect of the invention, in the tool with a holder as described in the fifth aspect, the tool with a holder is used for milling or grooving.

The present invention contemplates a tool with a holder for milling or a tool with a holder for grooving. By use of the tools with a holder, milling and grooving can be favorably performed.

A metallic component of the TiAlN-type hard coating in the present invention is not limited to TiAl. So long as a coating of high hardness and high wear resistance can be formed, a composition may be such that a metallic component, such as a metal belonging to Group 4a, 5a, or 6a, Si, Y, or a rare-earth element, is present in the TiAl alloy while forming solid solution to some extent. No particular limitations are imposed on the metallic component ratio between Ti and Al or those between other metals. Further, a light element to be contained in addition to a metallic component is not limited to nitrogen, but may be a composite which contains carbon, oxygen, boron, or the like.

The above and other features of the invention including various and novel details of construction and combination of parts will now be more particularly described with reference to the accompanying drawings and pointed out in the claims. It will be understood that the particular cutting tool embodying the invention is shown by way of illustration only and not as a limitation of the invention. The principles and features of this invention may be employed in varied and numerous embodiments without departing from the scope of the invention.

BRIEF DESCRIPTION OF THE DRAWINGS

FIG. 5 is a table of results from experiments performed on examples of the present invention and comparative examples.

DETAILED DESCRIPTION OF THE INVENTION

Illustrative, non-limiting examples of a cutting tool and a tool with a holder according to the present invention are described below.

a) First, a cutting tool of the present embodiment will be described.

Figure 1:
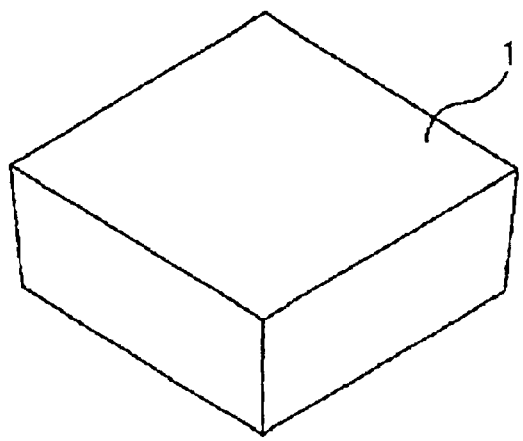
FIG. 1 is a perspective view of a cutting tool according to an embodiment of the present invention.
Figure 2:
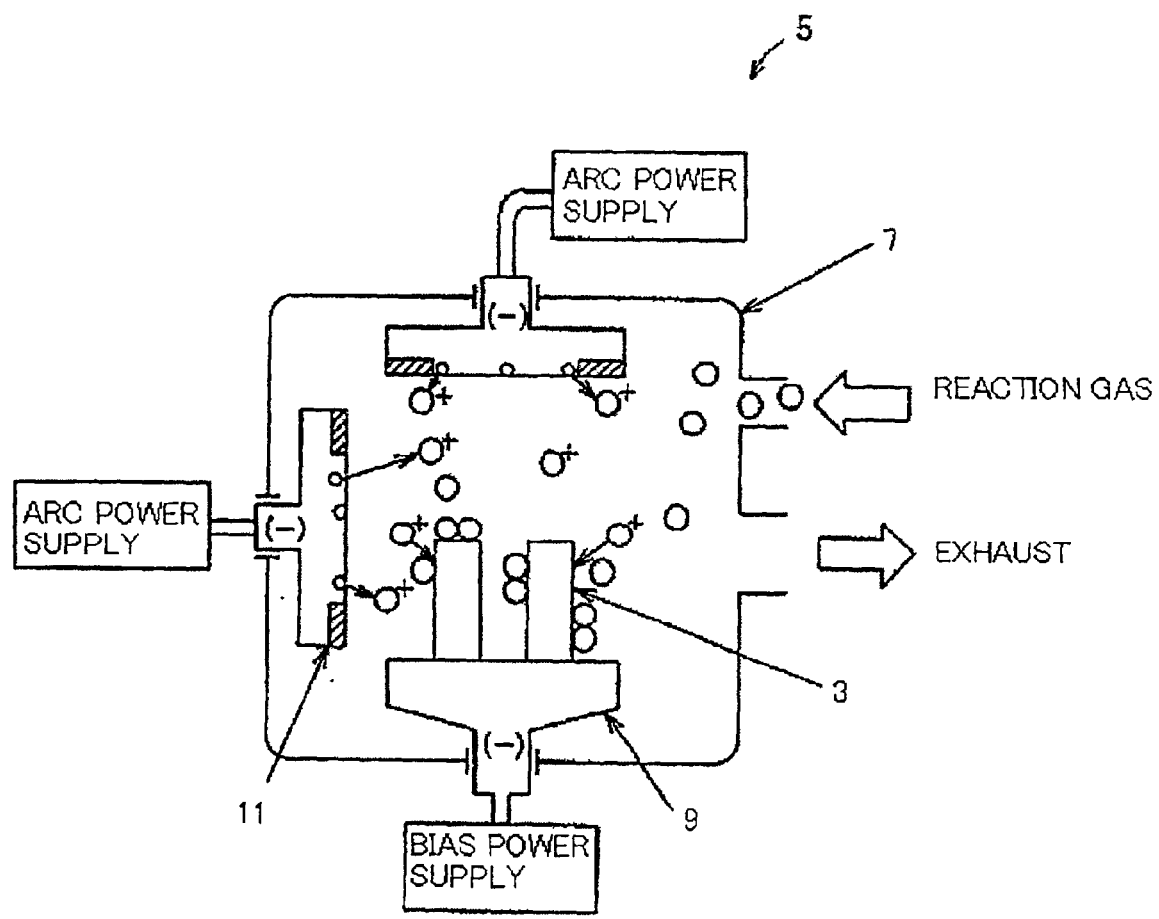
FIG. 2 is a schematic view of an arc-ion-type PVD apparatus.

As shown in FIG. 1, a cutting tool 1 of the present embodiment is a throwaway tip configured such that a hard coating is formed on the surface of a substrate 3 (see FIG. 2). The substrate 3 may be formed of, for example, a hard material of cemented carbide (WC-Co-type cemented carbide) equivalent to JIS K10, which is defined in JIS B 4053 (1989), and polished into the shape of ISO SPGN120312. Specifically, the cutting tool 1 is a plate-shaped positive tip whose rake face (the main surface side), which is the upper face in FIG. 1, is wider than the opposite face. The surface of the substrate 3 is coated with a hard coating having a thickness ranging from 1 $\mu$m to 5 $\mu$m (e.g., 3 $\mu$m), formed of a TiAlN material, for example, (Ti,Al)N, and having a Ti/Al ratio of 1.

According to the present embodiment, coarse grains present in the hard coating and having a size not less than the thickness of the hard coating (e.g., coarse grains having a size not less than 3 $\mu$m) occupy not greater than 5% of the surface area of the hard coating. The surface of the hard coating has a surface roughness Ra of not greater than 0.1 $\mu$m and a surface roughness Rz of not greater than 1 $\mu$m. The hard coating may satisfy at least either a requirement for a surface roughness Ra of not greater than 0.1 $\mu$m or a requirement for a surface roughness Rz of not greater than 1 $\mu$m.

b) Next, a method for manufacturing the cutting tool 1 will be described.

First, materials for the substrate 3 (i.e., a WC powder and a Co powder) are measured out in respective predetermined amounts, followed by wet mixing and pulverization. Paraffin is then added to the pulverized material in an amount of 2% by weight. The resultant mixture is dried and granulated, thereby yielding a powder for compaction. The powder is pressed into a predetermined positive-tip shape, followed by firing in a vacuum. The fired body is then polished into the substrate 3 whose dimensions fall within a predetermined dimensional tolerance range.

Next, the substrate 3 is coated with a TiAlN material by PVD coating. The PVD coating step involves an arc-ion-type physical vapor deposition process, whereby a hard coating is formed on the surface of the substrate 3 to thereby complete the cutting tool 1.

The above-mentioned arc-ion-type vapor deposition process will next be described.

An arc-ion plating device (an arc-ion-type PVD apparatus) 5 as shown in FIG. 2 is used, and the substrate 3 is placed on a turntable 9 within a vacuum chamber 7. While reaction gas (e.g., $N_2$) is being supplied into the vacuum chamber 7, bias voltage (−) is applied to the substrate 3 via the turntable 9, and arc voltage (−) is applied to an evaporation source (cathode) 11. The cathode 11 carries a metallic material (TiAl alloy) that forms a hard coating. Namely, metal ions of Ti and Al from the cathode 11 are deposited on the surface of the substrate 3. The supplied reaction gas ($N_2$) reacts with the deposited metal ions, thereby forming a hard coating of (Ti,Al)N that has a Ti/Al ratio of 1 on the surface of the substrate 3.

According to the present embodiment, physical vapor deposition is performed under the coating conditions (PVD Condition 1) specified below. The thickness of the hard coating corresponds to the coating time.

PVD Condition 1

Metallic Material: TiAl Alloy having a Ti/Al Ratio of 1

Reaction Gas Pressure: 1.20 Pa

Substrate Temperature: 500° C.

Bias Voltage: −150 V

Arc Current: 100 A

Notably, the surface roughness of the coating can be adjusted through adjustment of the applied current and voltage, and gas pressure.

c) Next, a tool with a holder on which the cutting tool 1 is mounted will be described.

Figure 3A:
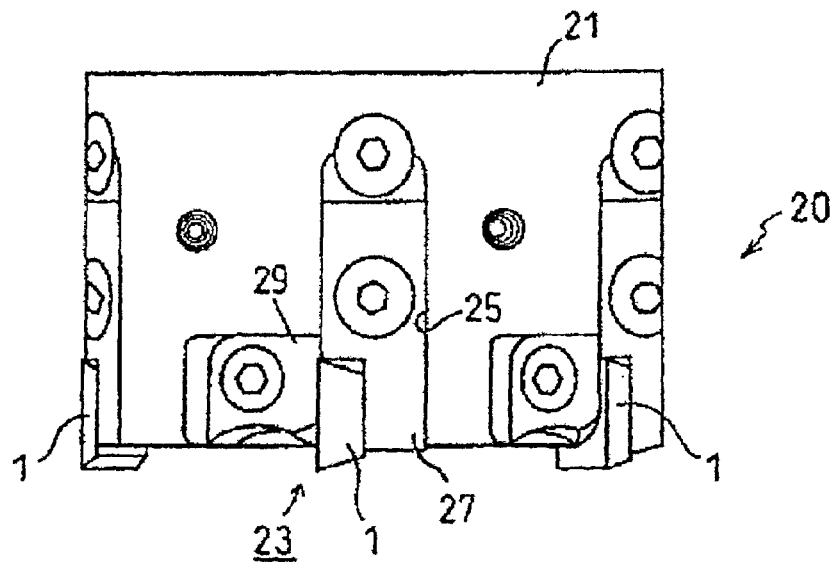
FIGS. 3(a) and 3(b) are top and front views, respectively, of the cutting tools of the embodiment mounted on a holder.
Figure 3B:
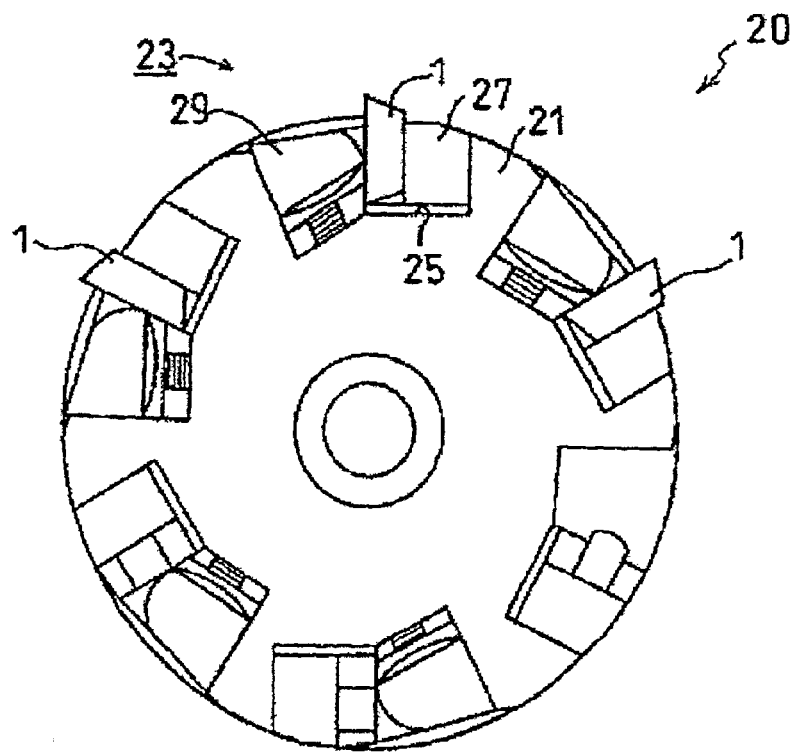

As shown in FIG. 3(a) and FIG. 3(b), a tool with a holder (milling cutter) 20 of the present embodiment includes a substantially columnar cutter body (holder) 21 and is configured such that six cutting portions 23 are circumferentially provided on the outer circumference of the holder 21 on the side toward the front end (on the side toward the machining face) of the holder 21.

Specifically, six mounting portions 25, each in the form of a recess, are circumferentially provided on the outer circumference of the holder 21 on the side toward the front end of the holder 21. In each of the mounting portions 25, the cutting tool (tip) 1, an alloy steel cartridge 27 for retaining the cutting tool 1, an alloy steel wedge 29, and a like member are disposed, thereby constituting the cutting portion 23.

In FIG. 3(b), to clarify the structure of the milling cutter, among six cutting portions 23, two cutting portions 23 are illustrated such that the cutting tool 1 is not disposed, and one cutting portion 23 is illustrated such that the cutting tool 1 and the wedge 29 are not disposed.

d) As described above, the cutting tool 1 of the present embodiment is configured such that the TiAlN-type hard coating formed on the surface of the substrate 3 have a thickness of 1 to 5 µm, and coarse grains present in the hard coating, which has a size that is not less than the thickness of the hard coating, occupy 5% or less of the surface area of the hard coating, thereby reducing the possibility that resistance to joining through fusion and wear resistance are impaired by the dropping-off of a coarse grain.

The cutting tool 1 of the present invention has a very smooth surface. Specifically, Ra is not greater than 0.1 µm, and Rz is not greater than 1 µm. Accordingly, in the course of a work material rubbing against the coating surface, the dropping-off of a grain becomes unlikely, and frictional resistance is low. As a result, joining of a work material through fusion (and exfoliation) becomes unlikely, whereby high cutting performance is maintained.

The present embodiment yields the following marked effect: an impairment in cutting performance (resistance to joining through fusion and wear resistance), which would otherwise arise from dropping-off of a coarse grain, does not arise, whereby excellent cutting performance can be reliably maintained over a long period of time. Therefore, use of the milling cutter 20 equipped with the above-described cutting tools 1 allows stable cutting over a long period of time.

e) Next, an experiment for verifying the effect of the present embodiment will be described.

(1) Substrates were manufactured by the previously described manufacturing method of the present embodiment. The substrates were subjected to coating under the aforementioned PVD Condition 1 by use of the arc-ion physical vapor deposition process, whereby a hard coating was formed on the surface of each substrate. In this manner, cutting tool Sample Nos. 2 to 4, which fall within the scope of the present invention, were prepared.

Cutting tool Sample No. 7, which falls within the scope of the present invention, was manufactured in the following manner. A substrate similar to that of the embodiment was subjected to coating under the coating conditions specified below (PVD Condition 2) by use of an arc-ion-type PVD apparatus similar to that used in the embodiment.

PVD Condition 2

Reaction Gas Pressure: 1.33 Pa

Substrate Temperature: 500° C.

Bias Voltage: −200 V

Arc Current: 150 A

Comparative Examples, in which the coating thickness falls outside of the scope of the present invention, were manufactured in the following manner. Substrates similar to those of the embodiment were subjected to coating under the aforementioned PVD Condition 1 by use of an arc-ion-type PVD apparatus similar to that used in the embodiment. In this way, cutting tools of Comparative Examples (Sample Nos. 1 and 5) were yielded.

Another Comparative Example, in which the percentage of surface area occupied by coarse grains falls outside of the scope of the present invention, was manufactured in the following manner. A substrate similar to that of the embodiment was subjected to coating under the coating conditions specified below (PVD Condition 3) by use of an arc-ion-type PVD apparatus similar to that used in the embodiment, whereby a cutting tool of Comparative Example (Sample No. 6) was yielded.

PVD Condition 3

Reaction Gas Pressure: 1.33 Pa

Substrate Temperature: 500° C.

Bias Voltage: −200 V

Arc Current: 200 A (2) The above-described cutting tool of an Example of the present invention and a conventional cutting tool were examined for the thickness of a hard coating and for the amount of coarse grains present in the hard coating and having a size that is not less than the thickness of the hard coating, by use of a scanning electron microscope.

Figure 4A:
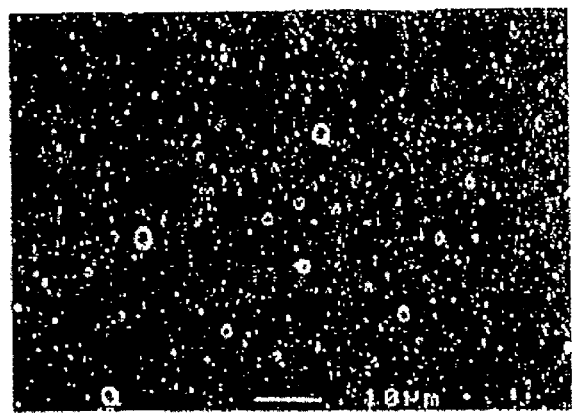
FIG. 4(a) is a scanning electron micrograph of the surface of the cutting tool of the present invention.

FIG. 4 shows scanning electron micrographs (1000 times magnification). FIG. 4(a) shows the cutting tool that falls within the scope of the present invention; i.e., the cutting tool of Sample No. 3. It exhibits presence of few coarse grains on the surface thereof, indicating that the surface is smooth. Measurement of Sample No. 3 showed that coarse grains having a size not less than 3 µm occupy 3% of the surface of the coating.

Figure 4B:
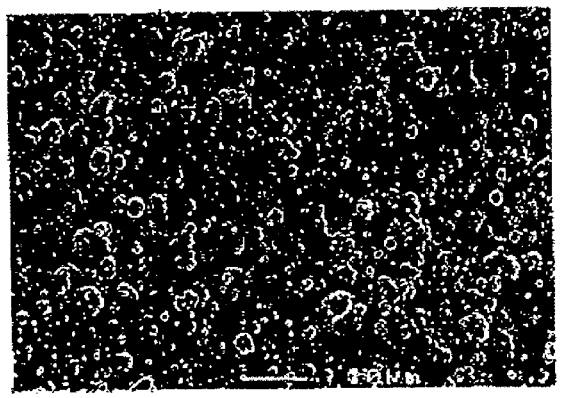
FIG. 4(b) is a scanning electron micrograph of the surface of the conventional cutting tool.

As compared with the cutting tool of the present invention, the conventional cutting tool shown in FIG. 4(b) exhibits an increased presence of coarse grains on the surface thereof, indicating that the surface is rough.

(3) The cutting tools of the Examples of the present invention and those of the Comparative Examples were measured for surface roughness Ra and surface roughness Rz, which indicate surface smoothness of a hard coating, by use of a surface roughness tester. The Ra and Rz measurements are defined in JIS B 0601 (1994). The results are shown in the table of FIG. 5.

(4) The cutting tools of the Examples of the present invention and those of the Comparative Examples were mounted on the holder of the milling cutter mentioned previously and were evaluated for cutting performance in terms of chipping resistance and thermal shock resistance, under conditions (i) and (ii) described below. These results are also shown in the table of FIG. 5.

A cutting tool exhibits the phenomenon that wear resistance or the like is impaired as a result of joining through fusion and associated exfoliation described previously. Microscopic observation of such an exfoliated portion indicates that exfoliation can be considered as chipping. Thus, an experiment on chipping resistance, which is considered as an indicator of resistance to joining through fusion (thus an indicator of wear resistance), was carried out. Since the condition of occurrence of chipping varies depending on thermal shock, an experiment on thermal shock resistance was also carried out.

(i) Chipping Resistance

In the chipping resistance test, cutting was performed under the conditions itemized below, and the number of shocks (the number of times cutting was performed) until a cutting tool was chipped was measured.

Cutting Rate: 200 m/min

Feed Rate: 0.07 mm/blade

Depth of Cut: 1.5 mm

Work Material: SNCM439 (HB300), Dry Type (ii) Thermal Shock Resistance

In the thermal shock resistance test, cutting was performed under the conditions itemized below, and the number of shocks (the number of times cutting was performed) until a cutting tool was chipped was measured.

In the case of the Examples of the present invention, since wet cutting is performed, a wet state and a dry state are repeated in every cutting. Therefore, this cutting operation served as the thermal shock resistance test.

Cutting Rate: 250 m/min

Feed Rate: 0.25 mm/blade

Depth of Cut: 1.5 mm

Work Material: SNCM439 (HB300), Wet Type

As is apparent from the table of FIG. 5, the cutting tools (Sample Nos. 2 to 4 and 7) which fall within the scope of the present invention are superior in cutting performance in terms of chipping resistance and thermal shock resistance (thus resistance to joining through fusion and wear resistance) as compared with the Comparative Examples (Sample Nos. 1, 5 and 6). Therefore, the cutting tool of the present invention provides stable cutting over a long period of time. Particularly, the cutting tools (Sample Nos. 2 to 4) which satisfy the preferred surface roughness requirement of the present invention are enhanced further in cutting performance.

Thus, the cutting tools of the present invention yield the following marked effect: an impairment in cutting performance, which would otherwise arise from dropping-off of a coarse grain, does not occur, whereby excellent cutting performance can be reliably maintained over a long period of time.

By contrast, the cutting tools of the Comparative Examples (Sample Nos. 1, 5, and 6) exhibit poor cutting performance in terms of chipping resistance and thermal shock resistance.

The present invention is not limited to the above-described embodiment, but may be embodied in various other forms without departing from the spirit or scope of the invention.

(1) For example, in addition to the aforementioned cemented carbide, various other hard materials, such as cermet, ceramic, and high-speed steel, can be used as material for the substrate of a cutting tool.

(2) Preferably, the aforementioned hard coating is formed through arc-ion-type physical vapor deposition. However, other known processes (e.g., ARE—activated reactive evaporation—process) can also be employed.

(3) The above embodiment is described while mentioning a milling cutter for milling use as a tool with a holder. However, the present invention is also applicable to a cutting tool for grooving use or a like cutting tool.

This application is based on Japanese Patent Application No. 2001-157481 filed May 25, 2001, the disclosure of which is incorporated herein by reference in its entirety.

What is claimed is:

1. A cutting tool comprising:

a substrate; and a TiAlN coating formed on the substrate, wherein the coating has a thickness in the range of from 1 to 5 μm, the coating includes coarse grains of TiAlN having a size that is not less than the thickness of the coating, and the coarse grains occupy not greater than 5% of the surface area of the coating.

2. The cutting tool as described in claim 1, wherein the coating has a surface roughness Ra of not greater than 0.1 μm.

3. The cutting tool as described in claim 1, wherein the substrate is formed from one of cemented carbide, cermet, ceramic, and high-speed steel.

4. The cutting tool as described in claim 1, wherein the coating is a vapor deposition film formed through arc-ion-type physical vapor deposition.

5. A tool with a holder, wherein a cutting tool as described in claim 1 is mounted on the holder.

6. The tool with a holder as described in claim 5, which is for use in one of milling and grooving.

7. The cutting tool as described in claim 1, wherein the coating has a Ti/Al ratio of 1.

8. The cutting tool as described in claim 1, wherein the cutting tool has a rake face that is wider than an opposite face.

9. The cutting tool as described in claim 1, wherein the coating has a surface roughness Rz of not greater than 1 μm.

* * * * *